United States Patent [19]
Howard et al.

[11] Patent Number: 5,603,847
[45] Date of Patent: Feb. 18, 1997

[54] ANNULAR CIRCUIT COMPONENTS COUPLED WITH PRINTED CIRCUIT BOARD THROUGH-HOLE

[75] Inventors: James R. Howard, Santa Clara; Gregory L. Lucas, Newark; Scott K. Bryan; Jin S. Choe, both of San Jose; Nicholas Biunno, Santa Clara, all of Calif.

[73] Assignee: Zycon Corporation, Santa Clara, Calif.

[21] Appl. No.: 220,540

[22] Filed: Apr. 5, 1994

Related U.S. Application Data

[63] Continuation-in-part of Ser. No. 44,301, Apr. 7, 1993, Pat. No. 5,347,258.

[51] Int. Cl.⁶ .................................................. B44C 1/22
[52] U.S. Cl. ........................................... 216/17; 216/18
[58] Field of Search .................................. 216/13, 17, 18; 427/97; 29/852; 338/333

[56] References Cited

U.S. PATENT DOCUMENTS

| | | | |
|---|---|---|---|
| 2,811,621 | 10/1957 | Mucher et al. | 201/63 |
| 3,554,877 | 1/1971 | Geisler | 216/17 X |
| 3,582,842 | 6/1971 | Friedman | 333/81 |
| 4,045,636 | 8/1977 | Yoder et al. | 200/292 |
| 4,130,857 | 12/1978 | Brower | 362/10 |
| 4,404,059 | 9/1983 | Livshirts et al. | 216/17 |
| 4,735,676 | 4/1988 | Iwasa | 156/630 |
| 4,808,967 | 2/1989 | Rice et al. | 338/309 |
| 4,825,536 | 5/1989 | Itemadami et al. | 29/620 |
| 4,870,746 | 10/1989 | Klaser | 29/620 |
| 4,888,574 | 12/1989 | Rice et al. | 338/309 |
| 4,892,776 | 1/1990 | Rice | 428/209 |
| 4,911,796 | 3/1990 | Reed | 204/15 |
| 4,964,948 | 10/1990 | Reed | 156/659.1 |
| 5,039,570 | 8/1991 | Sturm | 428/209 |
| 5,100,695 | 3/1992 | Kawakami et al. | 427/96 |

*Primary Examiner*—William Powell
*Attorney, Agent, or Firm*—Robert Charles Hill

[57] ABSTRACT

A circuit component assembly and a method for forming the assembly as an annular body in a laminate, preferably between a trough-hole or via and a surrounding conductive layer in a PCB are disclosed, the circuit component assembly including one or more resistors/conductors, inductors and dielectrics/capacitors or combinations thereof, outer and inner peripheries of the circuit component preferably having substantially constant radii permitting simple determination of operative electrical characteristics for the circuit component from (a) the inner and outer radii, (b) an effective thickness for the circuit component and (c) its electrical characteristics determined by the material formed in the annular recess, the circuit component body preferably being formed from a liquid precursor forming conductive interconnections for the circuit component assembly at its outer and inner perimeters.

17 Claims, 8 Drawing Sheets

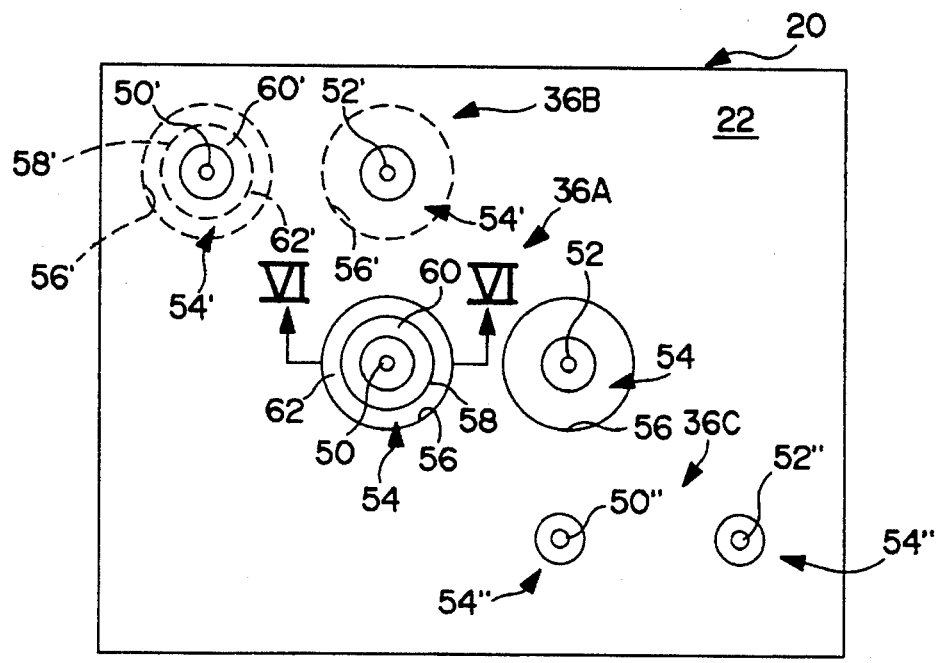
FIG. 5A
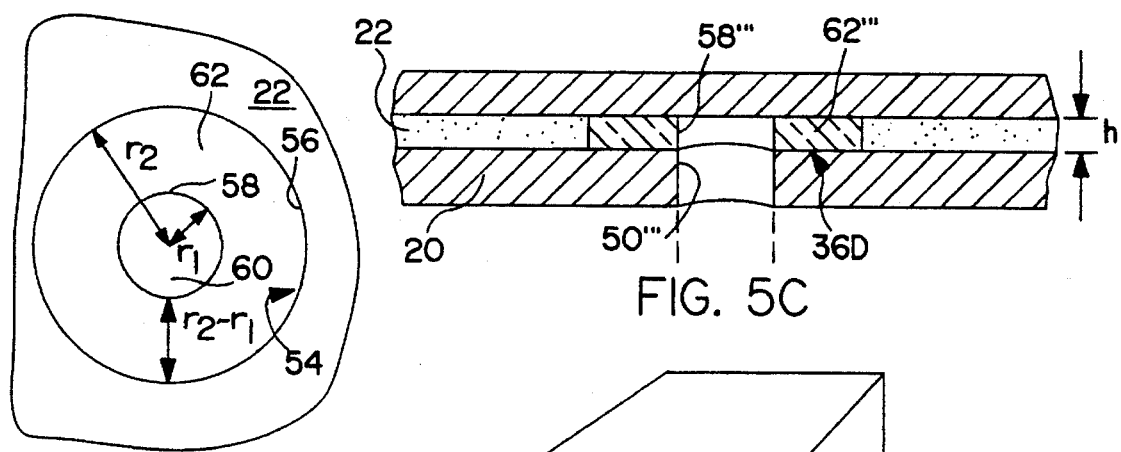
FIG. 5B
FIG. 5C
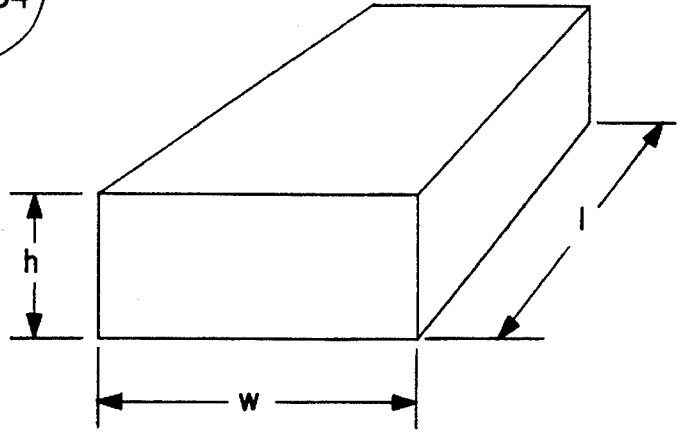
FIG. 5D

5,603,847

ANNULAR CIRCUIT COMPONENTS COUPLED WITH PRINTED CIRCUIT BOARD THROUGH-HOLE

This is a continuation-in-part of U.S. patent application Ser. No. 08/044,301 filed Apr. 7, 1993, U.S. Pat. No. 5,347,258, under assignment to the assignee of the present invention.

FIELD OF THE INVENTION

The present invention relates to printed circuit boards and more particularly to printed circuit boards including various devices or components to be coupled with individual passive circuit components such as resistor/conductors, inductors or dielectric/capacitors and compound circuit components (networks) formed from combinations of passive circuit component.

BACKGROUND OF THE INVENTION

The present invention is directed toward printed circuit boards (PCBs) and the like. These circuit boards typically include large numbers of electronic devices which are commonly surface mounted and also additional component which may be present in the form of active layers within or on each PCB. The requirement for the devices and components in such printed circuit boards are subject to conventional electronic design restraints.

More specifically, many of the surface mounted devices and other components on such PCBs commonly require coupling with individual passive circuit components such as resistor/conductors, inductors or dielectric/capacitors in order to achieve their desired function.

The solution to this problem in the prior art has been the use of individual discrete passive components commonly surface mounted on the PCBs. PCB design has further required the provision of though-holes in order to properly interconnect the passive circuit components. In this regard, the passive circuit components may be interconnected between any combination of surface devices or component, active circuit components or layers formed on or within the PCBs.

Accordingly, the provision of such discrete or individual passive circuit components has increased the complexity of the PCBs and at the same time either decreased the available surface area of the PCBs for other devices or else resulted in an overall increase in the size of the PCBs to accommodate necessary surface devices and components including passive circuit components.

A more recent solution to this problem in regard to resistive circuit components in the prior art has been the provision of planar components, typically resistors, preferably formed on layers of the PCBs to replace prior art surface mounted resistors as described above, thus making surface portions of the PCBs free for other uses.

Although such planar resistors provide advantages in certain applications over discrete surface mounted resistors, they have still tended to result in relative increases in the complexity and space demands on the PCBs. For example, if the planar resistors are formed on a surface layer of the PCB, it is of course possible to arrange an active surface device over the resistor. However, that surface portion of the PCB occupied by the planar resistor must be dedicated to the planar resistor itself. Accordingly, that portion of the board is not available for mounting pads, through-holes or the like.

At the same time, it is also necessary to provide conductive couplings for interconnecting the surface formed planar resistors in order couple them with active devices or components in the PCBs. Here again, plated through-holes have commonly been employed for this purpose and further increase complexity and space demands in the PCBs.

Planar resistors of the type described above have also been formed on internal layers or planes of the PCBs. Such a configuration permits the use of standard subtractive PCB techniques, for example, to produce conductor patterns and resistor elements suited for high speed and high density circuit applications. However, even with planar resistors formed on internal layers of the PCBs, it is still necessary to provide plated through-holes or other conductors extending in a Z direction through the PCBs in order to provide the necessary couplings for the planar resistors with various surface mounted devices or components in the PCBs.

Thus, there has been found to remain a further need for improvements in the provision of passive circuit components and compound circuit components formed by combinations of passive circuit components for use in PCBs.

SUMMARY OF THE INVENTION

It is accordingly an object of the present invention to provide an improved design for PCBs and the like including circuit components on external surfaces or internal layers of the PCBs.

It is particularly contemplated in connection with the present invention that the circuit components be formed from generally conventional materials exhibiting desired characteristics.

The circuit components may include, for example, resistors/conductors, inductors, dielectrics/capacitors, combinations of the above and possibly additional components as well. Within the scope of the present invention, it is to be noted that all resistors necessarily exhibit conductance and similarly all conductors necessarily exhibit some resistance. Accordingly, resistors and conductors are considered as a generally constant spectrum dependent only upon the specific resistance and conductance of the component of the component. Similarly, a dielectric component may function as a true dielectric or isolating component or as a capacitor depending upon the specific dielectric constant for the component. Accordingly, dielectrics and capacitors are also considered as a generally continuous spectrum in the present invention depending upon the specific dielectric constant.

However, it is a more particular object of the invention to form the circuit components of the present invention in combination with through-holes in the PCB.

The term "circuit board" is employed herein to include printed circuit boards and other device substrates such as integrated devices, multi-chip modules and similar devices having signal traces on different layers.

The term "through-hole" is employed herein to refer to any Z directional conductor formed in the PCB for interconnecting a surface device or PCB component with a conductive layer on or in the PCB. For example, through-holes are commonly employed for interconnecting surface mounted devices on the PCB either with an internal conductive layer or plane within the PCB or even a surface conductive layer on the PCB. In the latter case, the most common arrangement would be a through-hole interconnecting a surface device on one side of the PCB with a conductive layer or plane on the opposite surface of the PCB. At the same time, through-holes of the type defined above are also employed for interconnecting surface mounted devices or components arranged on or in the PCB with conductive layers or planes formed either on or in the PCB. Accordingly, the present invention preferably contemplates formation of its circuit component or components in combination with through-holes as defined above. The through-hole described above may also be replaced by a central conductor, the central conductor thus serving as a means for completing a circuit including the circuit component assembly of the present invention and the surrounding conductive layer.

More specifically, it is an object of the invention to provide a resistor/conductor assembly in a PCB, the assembly including a conductive through-hole formed in the PCB for interconnection with a surface device or other PCB component, a conductive pad surrounding and conductively interconnected with the plated through-hole, a conductive layer surrounding and generally coplanar with the conductive pad and spaced apart from the conductive pad to form an annular recess, a resistor/conductor assembly being arranged in the annular recess and formed from a conductive material having a selected resistivity and outer and inner perimeters respectively conductively interconnected with the conductive layer and the conductive pad whereby the resistor/conductor assembly is electrically coupled along with the plated through-hole between the conductive layer and the surface device or component.

Broadly, the present invention contemplates such a resistor/conductor or resistor/conductor assembly wherein the annular recess forms a continuous channel or separation between the conductive layer and the conductive pad or plated through-hole. At the same time, the resistor/conductor assembly is arranged in the annular recess and is preferably at least co-extensive with the annular recess. In such a co-extensive arrangement, the resistor/conductor assembly either extends just between the outer and inner perimeters or may even overlap the outer and inner perimeters as described in greater detail below.

It is a further related object of the invention to provide such a resistor/conductor assembly wherein the outer and inner perimeters of the resistor/conductor assembly are each formed with a substantially constant radius with the resistor/conductor assembly being at least generally coextensive with the annular recess whereby the operative resistance of the resistor/conductor assembly may be simply determined from the radii of its outer and inner perimeters, and effective thickness, of the assembly and its resistivity. It is even more preferably contemplated that the conductive layer and conductive pad have generally equal thicknesses at their respective interconnections with the resistor/conductor assembly for establishing the effective thickness of the assembly. In this case, the resistor/conductor assembly is assumed to have a thickness approximately equal to those of the conductive layer and conductive pad.

Within such a configuration, the resistor/conductor assembly may readily be formed, for example, by deposition of a liquid precursor or by other methods of formation which will be apparent from the following description.

It is more broadly an object of the invention to provide such a resistor/conductor assembly at the juncture of a plated through-hole in a PCB with a surrounding conductive layer, the assembly having an outer perimeter conductively interconnected directly with the conductive layer and an inner perimeter conductively interconnected with the plated through-hole. Here again, the outer and inner perimeters of the resistor/conductor assembly are preferably formed with substantially constant radii so that the operative resistance of the assembly may be simply determined from the radii of its outer and inner perimeters, an effective thickness of the resistor assembly and its resistivity.

It is further contemplated in connection with the objects set forth above that the operative resistance of the resistor or resistor/conductor assembly be capable of estimation in the manner summarized above. More specifically, a typical method for estimating the operative resistance of the resistor/conductor is set forth immediately below.

At least in a preferred embodiment of the present invention with the outer and inner peripheries of the resistor/conductor assembly having constant radii, the effective resistance of the assembly may be determined as follows, having reference to FIG. 5B.

If R equals resistance, then it may be calculated as $$R = \frac{pL}{wH}$$

where R equals resistance in ohms, p equals resistivity of the resistor in ohms centimeters, L equals the length of the resistor in centimeters, w equals the width of the resistor in centimeters and H equals the height of the resistor in centimeters (wH thus being the effective cross-sectional area of the resistor for purposes of calculating its resistance).

Referring briefly to FIG. 5B, as described below, the resistor body 62 is graphically illustrated with substantially constant radii forming its outer and inner peripheries 56 and 58. Further, since the resistor body 62 forms a resistor between the conductive pad 60 and the conductive layer or upper surface 22, then the effective length of the resistor body 62 is equal to the radial dimension of the resistor body, that is $r_2-r_1$. The effective width of the resistor body is thus the mean circumference of the resistor body, that is the circumference of the resistor body generated from a point mid-way between the outer and inner peripheries 56 and 58. Thus, the effective width of the resistor body may be stated as follows:

$$W = 2\left[\frac{r_2-r_1}{2} + r_1\right]\pi$$

These effective values for length and width may then be substituted into the basic equation set forth above for resistance. It may readily be seen from FIG. 5B that the overall resistance of the resistor body will be proportional to the differential radius, that is $r_2-r_1$. At the same time, resistance is inversely proportional to the effective width of the resistor body as stated above.

The above equations can readily be employed for adjusting the radii of the outer and inner peripheries of the resistor body in order to provide any desired resistance, at least given the effective height (H) for the resistor body. It is also possible of course to permit variation of the effective height of the resistor body for purposes of determining overall resistance.

The equations set forth above thus readily facilitate the calculation of resistance relative to dimensions for a preferred embodiment of the resistor body as illustrated in FIG. 5B. At the same time, variations in the configuration of the resistor body may similarly be included in such mathematical determinations, but possibly with increased complexity relative to the equations set forth above.

The summary includes numerical labels described in greater detail below but set forth here for the purpose of facilitating application of the summarized equations with the preferred embodiments described below.

In a preferred embodiment of the present invention with the outer and inner peripheries of the resistor or resistor assembly having constant radii, the effective resistance of an annular resistor or resistor/conductor assembly may be more precisely determined as follows, having continued reference to FIGS. 5B and 5D.

Generally, the macroscopic quantities voltage (V), current (i), and resistance (R) apply to a particular body or extended shape. The macroscopic quantities are determined from the corresponding microscopic vector quantities (point quantities) electric field (E), current density (j), and scalar quantity resistivity ($\rho$). The microscopic quantities are expressed as, $$E = \rho j \qquad (1)$$

and the corresponding macroscopic quantities are expressed as, $$V = iR \qquad (2)$$

The resistance of a material between points a and b (of any material shape) can be expressed in microscopic tens by the following relationship, $$R = \frac{V_{ab}}{i} = \frac{\int_b^a E dl}{\int j dS} \qquad (3)$$

In this expression, the line integral dl defines the line ab along the path E, and a closed loop path is defined by the surface integral dS, which corresponds to the area enclosed by a current i.

The above microscopic expression applied to a rectangular resistor body with dimensions (h, w, l), as shown in FIG. 5D, upon integration, readily yields the macroscopic quantity which states that the resistance of a rectangular resistor body is directly proportional to its length and indirectly proportional to its cross-sectional area, $$R = \frac{\int_b^a E dl}{\int j dS} = \frac{E}{j} \frac{l}{wh} = \rho \frac{l}{wh} \qquad (4)$$

The error analysis for this relationship (regarding the rectangular geometry) is straight forward and is expressed as, $$\frac{\Delta R}{R} = \left( \frac{\Delta \rho}{\rho} + \frac{\Delta l}{l} \right) - \left( \frac{\Delta w}{w} + \frac{\Delta h}{h} \right) \qquad (5)$$

A model of an annular resistor is shown in FIG. 5B. The model has been simplified in that the resistor body does not overlap the top of the conductor plane. Overlapping the conductor plane reduces the resistance of the resistor per unit volume by exposing more resistor contact area to the copper foil. If overlap cannot be avoided, the expression can be modified to account for overlap as shown by equation (7) below.

Referring to FIG. 5B, an annular resistor body 62 is graphically illustrated with substantially constant radii forming its outer and inner peripheries 56 and 58. The resistance value of the annular geometry can only be approximated and is not accurately described by the above expression relating to the rectangular resistor geometry. The cross-sectional area of the annular resistor is a continuously and smoothly changing function of the radii. This functionality is described by the logarithmic ratio of the outer to inner diameter. Assuming that the radial symmetry between the inner contact pad 60 and the annular resistor body 62 is controlled and maintained during processing, then, the resistance of the annular resistor geometry is exactly expressed as:

$$R = \frac{\int_b^a E dl}{\int j dS} = \frac{E}{j} \frac{\int_{r_1}^{r_2} \frac{dr}{r}}{\int_0^h \int_0^{2\pi} r dh d\phi} = \qquad (6)$$

$$\frac{\rho}{2\pi h} \int_{r_1}^{r_2} \frac{dr}{r} = \frac{\rho}{2\pi h} \ln \frac{r_2}{r_1}$$

Further, if overlap cannot be avoided, the above expression can be modified as follows:

$$R(\rho, h, d_1, d_2) = \frac{\rho}{2\pi h} \ln \frac{d_2}{d_1} + \rho[\text{OVERLAP FACTOR}] \qquad (7)$$

In this expression, $d_2/d_1$ describes the ratio of the outer to inner diameters.

The error function for the annular geometry equation for resistance is given by:

$$\frac{\Delta R}{R} = \frac{\Delta r_2}{r_2} - \frac{\Delta r_1}{r_1} + \ln \frac{r_2}{r_1} \left[ \frac{\Delta \rho}{\rho} - \frac{\Delta h}{h} \right] \qquad (8)$$

The above equations can readily be employed for adjusting the radii of the outer and inner peripheries of the annular resistor body in order to provide a desired resistance, at least given the effective height (h) for the resistor body. It is also possible of course to permit variation of the effective height of the resistor body for purposes of determining overall resistance.

The equations set forth above thus readily facilitate the exact calculation of resistance relative to dimensions for a preferred embodiment of the resistor body as illustrated in FIG. 5B. The function $R(\rho,h,d_1,d_2)$ and likewise the error function of R have four dependent variables, with the dependency of those variables relating to processing conditions such as control over ring thickness, ring dimensions and planarization. In the annular geometry of the preferred embodiment, the logarithmic function (of the cross-sectional area of the annulus) controls the resistive value of resistor body. In order to visualize resistance tolerance of a processed annular ring resistor, a plot of the error function equation (8) against the ratio of the outer to inner diameters is illustrated in FIG. 13. In order to provide an example of what can be expected from the resistive tolerance of the annular ring geometry, the parameters and tolerances chosen for this evaluation are as follows: d1=20±1.0 mil., d2=20 to 68±1.0 mil., h=1.25±0.25 mil and $\rho$=1000±100$\Omega$mil. These particular parameters and tolerances were chosen for purpose of example only, and are not intended to be limiting in the present invention.

By consideration of a permutation of the tolerance examples of the four variables, the above figure defines an envelope for the tolerance range of R. The tolerance range is bounded to all values inside this envelope. The tolerance envelope of FIG. 13 illustrates that the annular resistor tolerance is dominated by the logarithmic dependence of the radii (the log function relating to the cross-sectional area of de annulus), that logarithmic function being non-linear. However, FIG. 13 indicates that the tolerance range does generally increase, allowing better tolerance control in processing when the annular geometry is taken into consideration. In this regard, the error function indicates that the outer ring diameter should be not more than 2 times the inner diameter in order to keep the resistance tolerance low (<20%).

It is further contemplated by the present invention to provide inductor components of simplified design with reduced surface requirements.

It is particularly contemplated in connection with the present invention that the inductor components be formed from generally conventional materials such as iron ferrite disposed in a matrix structure to provide a selected inductance. Accordingly, the inductance of each inductor component of the present invention is determined by its dimensions and the permeability of the ferromagnetic material.

Just as with the resistor element of the present invention, it is a more particular object of the invention to provide a simplified design for the inductor components while reducing surface requirements within the PCB by forming the inductor components in combination with through-holes in the PCBs for interconnecting surface devices or components with conductive layers on or in the PCB.

More specifically, it is an object of the invention to provide an inductor assembly in a PCB, the assembly including a conductive through-hole formed in the PCB for interconnection with a surface device or other PCB component, a conductive pad surrounding and conductively interconnected with the plated through-hole, a conductive layer surrounding and generally coplanar with the conductive pad and spaced apart from the conductive pad to form an annular recess, an inductor assembly being arranged in the annular recess and formed from ferromagnetic material having a selected inductance and outer and inner perimeters respectively conductively interconnected with the conductive layer and the conductive pad whereby the inductive assembly is electrically coupled along with the plated through-hole between the conductive layer and the surface device or component.

Broadly, the present invention contemplates such an inductor or inductor assembly wherein the annular recess forms a continuous channel or separation between the conductive layer and the conductive pad or plated through-hole. At the same time, the inductor assembly is arranged in the annular recess and is preferably at least co-extensive with the annular recess. In such a co-extensive arrangement, the inductor assembly either extends just between the outer and inner perimeters or may overlap the outer and inner perimeters due to processing restraints.

It is a further related object of the invention to provide an annular inductor assembly wherein the outer and inner perimeters of the annular inductor assembly are each formed with a substantially constant radius with the annular inductor assembly being at least generally coextensive with the annular recess whereby the operative inductance of the annular inductor assembly per unit length to may be simply determined from the cross sectional area of the inductor assembly, the effective thickness of the inductor assembly and its permeability. It is even more preferably contemplated that the conductive layer and conductive pad have generally equal thicknesses at their respective interconnections with the annular inductor assembly for establishing the effective thickness of the inductor assembly. In this case, the annular inductor assembly is assumed to have a thickness approximately equal to those of the conductive layer and conductive pad.

Within such a configuration, the annular inductor assembly may readily be formed, for example, by deposition of a liquid precursor or by other methods of formation which will be apparent from the following description.

It is more broadly an object of the invention to provide such an annular inductor assembly at the juncture of a plated through-hole in a PCB with a surrounding conductive layer, the annular inductor assembly having an outer perimeter conductively interconnected directly with the conductive layer and an inner perimeter conductively interconnected with the plated through-hole. Here again, the outer and inner perimeters of the inductor assembly are preferably formed with substantially constant radii and the inductor is generally continuous between its outer and inner perimeters forming an annular ring structure. It is further contemplated in connection with the objects set forth above that the operative inductance of the inductor or inductor assembly be capable of calculation in the manner summarized above. More specifically, a typical and preferred method for calculating the operative inductance of the annular inductor or inductor assembly is set forth immediately below.

In a preferred embodiment of the present invention with the outer and inner peripheries of the annular inductor or inductor assembly having constant radii, the effective inductance may be determined as follows, having reference to FIG. 5B.

In FIG. 5B, an annular body is graphically illustrated with substantially constant radii forming its outer and inner peripheries. As with the annular resistor of the present invention, the cross-sectional area of the annular inductor is a continuously and smoothly changing function of the radii. This functionality is described by the logarithmic ratio of the outer to inner diameters. Assuming that the radial symmetry between the inner contact pad and the annular inductor body is controlled and maintained during processing, then the functional relationship for the annular inductor body may be expressed by the following:

Let:
 $\mu$=permeability (H m$^{-1}$) of the ferromagnetic core
 h=thickness of the ferromagnetic core
 and the inductance (L) per unit length for an annular core inductor having an inner radius of $r_1$ and an outer radius of $r_2$ may be determined in the following manner:

$$\frac{L}{h} = \mu \left[ \frac{1}{8\pi} + \frac{1}{2\pi} \ln\left(\frac{r_2}{r_1}\right) \right] (Hm^{-1})$$

The above equation can readily be employed for adjusting the radii of the outer and inner peripheries of the annular inductor body in order to provide a desired inductance, at least given the effective height (h) for the inductor body. It is also possible of course to permit variation of the effective height of the inductor body for purposes of determining overall inductance.

The equation set forth above thus readily facilitates the calculation of inductance relative to dimensions for a preferred embodiment of the inductor body with the same structure as that illustrated for the annular resistor body in FIG. 5B. At the same time, variations in the configuration of the inductor body may similarly be included in the mathematical determination, but possibly with increased complexity relative to the equation set forth above.

It is additionally contemplated by the present invention to provide dielectric/capacitor components of simplified design with reduced surface requirements in the same manner as discussed above in regard to the resistor and inductor components.

It is particularly contemplated in connection with the present invention that the dielectric/capacitor components be formed from generally conventional dielectric materials such as epoxies or resins (i.e. cyanate esters, polyimides and kapton materials) or other known dielectric materials such as ceramic particles or powders in a suitable matrix to provide a selected capacitance. Accordingly, the capacitance of each dielectric/capacitor component of the present invention is determined by the dielectric constant or relative permitivity of the dielectric material and its dimensions.

The dielectric/capacitor components of the present invention are contemplated to be provided for in a PCB in the same manner as for the resistor and inductor components discussed above, with a preferred embodiment having an annular ring structure formed in the same manner as the aforementioned components. In this regard, the dielectric/capacitor component is formed by a dielectric material disposed between the conductive layer and the conductive pad or through-hole. As with the resistor and inductor components of the present invention, the effective thickness of the dielectric/capacitor assembly may be established by the thicknesses of the conductive layer and conductive pad. Similarly, the effective capacitance may be determined in a generally similar manner as described above for resistance and inductance.

In this regard, the capacitance (C) per unit length for an annular capacitor assembly of the present invention formed with substantially constant radii and having an inner radius of $r_1$, an outer radius of $r_2$, and an effective thickness (h) may be determined by the following equation:

$$\frac{C}{h} = \frac{2\pi\epsilon}{\ln\frac{r_2}{r_1}}$$

$\epsilon$ being defined as follows:

$$\epsilon = 8.85 \frac{\text{picofarads}}{\text{meter}} (\epsilon_r)$$

where $\epsilon_r$ is the relative permutivity of the annular medium.

The above equation allows for the determination of the effective capacitance for a preferred embodiment of the annular capacitor assembly where $r_1$ and $r_2$ are substantially constant, but could be adapted for application to additional annular capacitor bodies where $r_1$ and $r_2$ are not constant.

It is further contemplated by the present invention that the circuit components may be employed to provide network circuit components such as high pass and low pass LC or RC (inductor-capacitor or resistor-capacitor) networks, pi-filter circuit networks and band pass circuit networks all comprising operative combinations of the passive circuit components of the present invention. The term "filter" refers herein to circuit components allowing certain selected frequency signals to pass through the circuit while blocking certain other frequency signals.

In this regard, at least portions of such network circuits of the present invention may be formed within an annular recess in internal or external layers of a PCB where an annular passive circuit component is arranged within a different annular circuit component to form a series of operatively interconnected concentric circuit component bodies as illustrated in FIG. 8 and described in greater detail below. Here, the term concentric is employed to mean a plurality of circuit component bodies having a common axis where those bodies may be of a variety of geometric shapes.

It is yet a further object of the invention to provide a method of forming a passive circuit component or circuit component assembly as defined above wherein an annular recess is formed in a conductive layer of a PCB, a circuit component assembly being formed in the annular recess from a selected material with its outer perimeter conductively interconnected with the conductive layer, a through-hole being formed in the PCB and plated with conductive material conductively interconnected with an inner perimeter of the passive circuit component assembly. The order in which the steps are performed may be changed. For example, the through-hole could be formed prior to deposition of the circuit component assembly in the annular recess. Here again, a conductive pad could also be formed about the plated through-hole for interconnection with the circuit component assembly.

It is a related object of the present invention to provide a method of forming an annular circuit component or component assembly by screening material into an annulus formed in a conductive layer of a PCB to form an annular resistor/conductor, inductor or dielectric/capacitor as disclosed by the present invention.

It is a further related object of the present invention to provide a multi-pass sequential process for screening materials into an annulus formed in a conductive layer in a PCB to create a series of conductively interconnected concentric annular circuit components in order to form a compound circuit according to the present invention.

It is also a further related object of the invention to provide a process as described above wherein the passive circuit component or circuit component assembly includes multiple components, preferably concentrically formed in the annular recess.

Additional objects and advantages of the invention are made apparent in the following description having reference to the accompanying drawings.

BRIEF DESCRIPTION OF THE DRAWINGS

FIG. 5A is a plan view of a capacitive laminate formed as a subassembly for inclusion in the PCB of FIG. 1 and illustrating, in greater detail, a resistor assembly formed according to the invention.

FIG. 5B is a fragmentary view of a single resistor body constructed according to the present invention and having a preferred configuration as also illustrated in FIG. 5A.

FIG. 5C is a view similar to FIG. 6 while illustrating the annular resistor formed on an internal layer of the PCB.

FIG. 5D illustrates a rectangular resistor body having dimensions (h, w, l).

DESCRIPTION OF THE PREFERRED EMBODIMENTS

Figure 1:
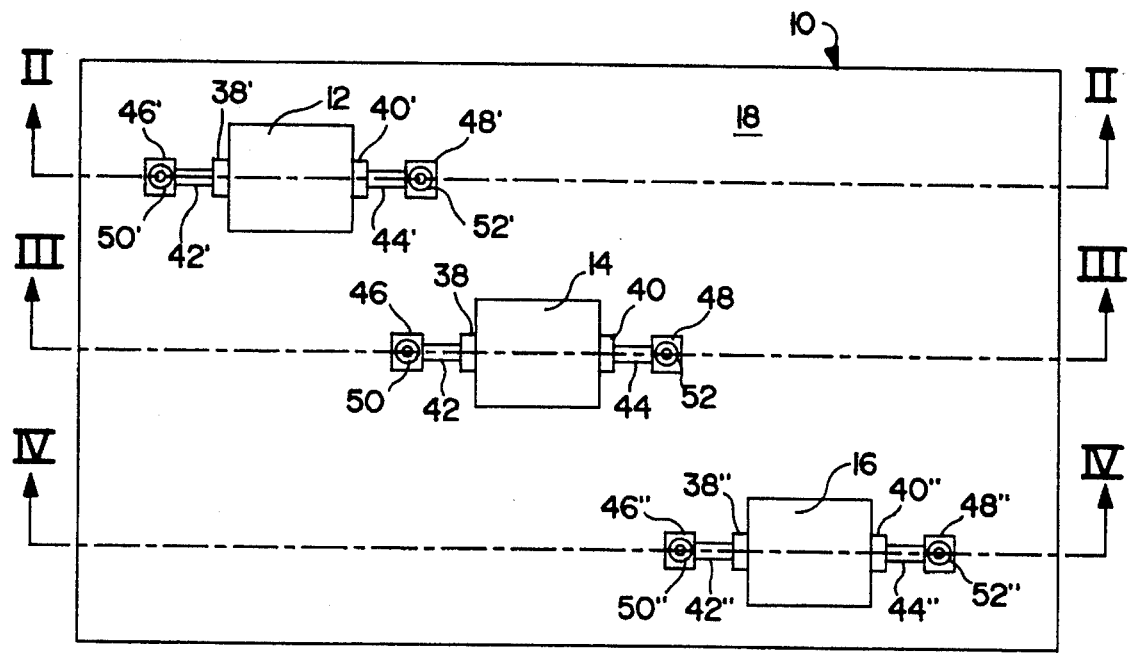
FIG. 1 is a plan view of a printed circuit board (PCB) with surface devices schematically illustrated for interconnection with various components of the PCB by respective through-holes.
Figure 2:
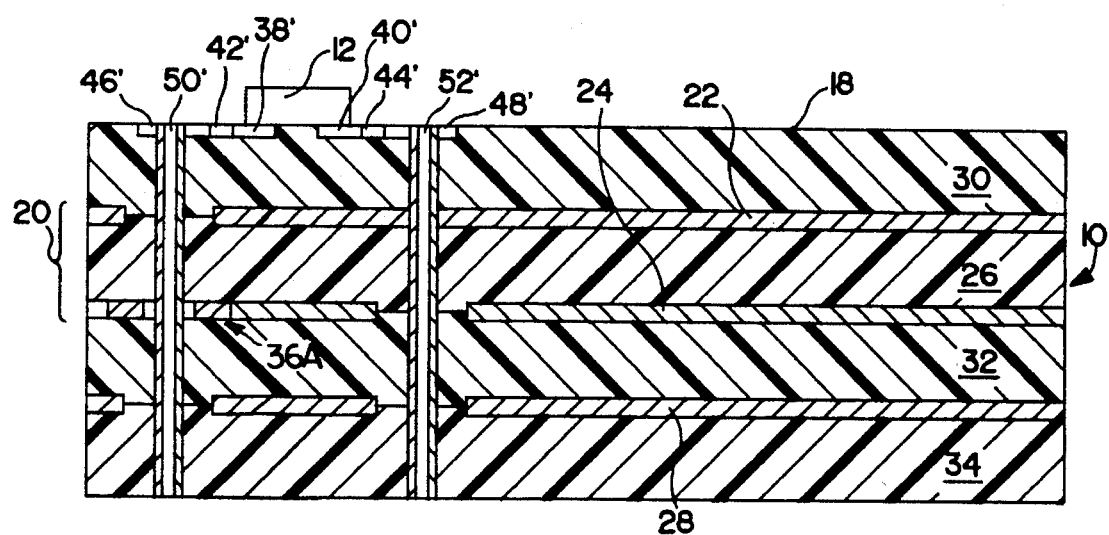
FIGS. 2, 3 and 4 are respectively view taken in section along section lines II—II, III—III and IV—IV of FIG. 1.
Figure 3:
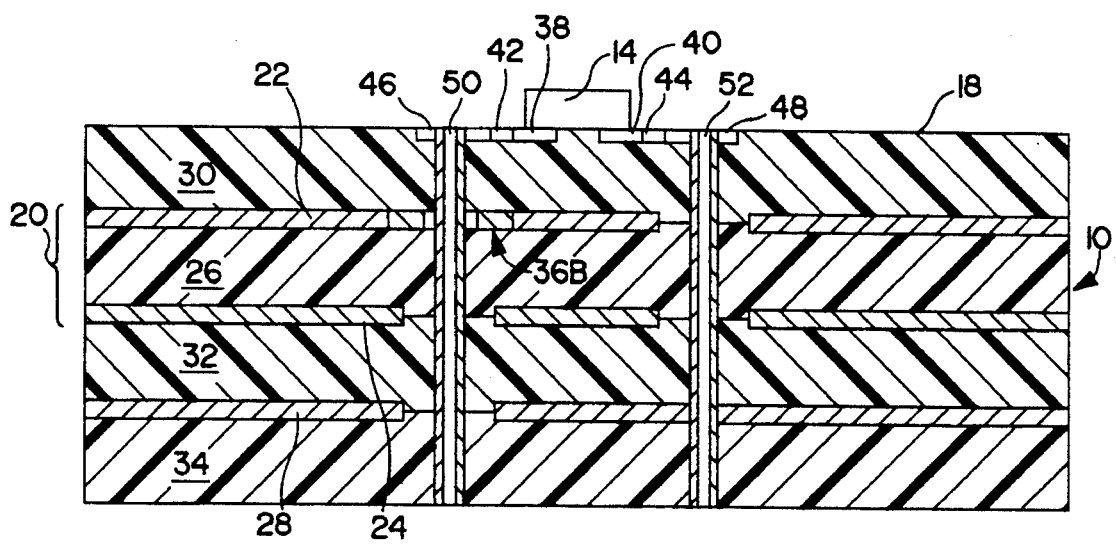
Figure 4:
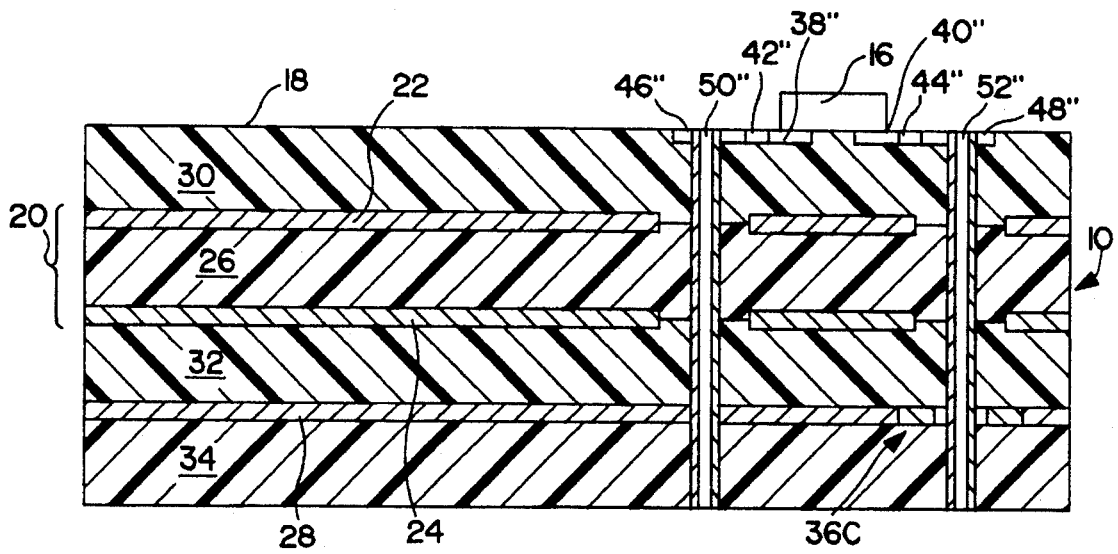

Referring now to the drawings and particularly to FIGS. 1–4, a printed circuit board (PCB) is generally indicated at 10 conventionally formed with multiple layers as described in greater detail below with reference to FIGS. 2–4. Surface mounted devices 12.14 and 16 are arranged upon an upper surface 18 of the PCB for interconnection with conductive layers within the PCB as described in greater detail below.

Referring to FIGS. 2–4, the internal layers of the PCB include a capacitive laminate 20 formed from conductive foils or layers 22 and 24 arranged on opposite sides of a dielectric layer 26 formed for example from epoxy or from other materials having a higher dielectric constant. The conductive foil 22 is a power plane for the PCB 10 while the other conductive foil 24 is a ground plane for the PCB. Such a higher dielectric constant could be provided for example by a layer of epoxy or other polymer filled with a material such as any of a variety of well known ceramics (not otherwise shown).

The PCB also includes another conductive layer or signal plane 28 and additional layers 30, 32 and 34 arranged on opposite sides of both the capacitive laminate 20 and the signal plane 28 to complete the PCB.

The PCB 10 is described only for purposes of example. The invention contemplates any of a variety of PCBs having any number of layers. As will be apparent from the following description, the invention also contemplates other devices or components in addition to the surface mounted devices 12, 14 and 16 which could be similarly interconnected with resistor bodies according to the present invention as described in greater detail below.

The surface devices 12, 14 and 16 are respectively interconnected with resistor assemblies 36A, 36B and 36C, which could be replaced by other circuit components according to the present invention. The resistor assemblies are similarly configured but arranged in different conductive layers or planes of the PCB 10 as described in greater detail below.

The surface mounted device 12 is mounted on the surface 18 of the PCB 10 for example by mounting pads 38 and 40 which are respectively interconnected with signal traces 42 and 44.

The signal traces 42 and 44 are respectively interconnected with additional pads 46 and 48 respectively interconnected with plated through-holes 50 and 52.

Referring also to FIG. 2, the resistor assembly 36A surrounds and is conductively interconnected with the through-hole 50 while also being interconnected with the conductive or ground plane 24 of the capacitive laminate 20.

The other plated through-hole 52 can be interconnected with any portion or component of the PCB 10 depending upon the desired operation for the surface mounted device 12. Similar through-hole interconnections are provided for the surface mounted devices 14 and 16. Accordingly, the corresponding components of the surface mounting connections for those devices are indicated respectively by primed numerals and double-primed numerals otherwise corresponding to the through-hole connections described above for the surface mounted device 12.

Referring particularly to FIG. 3, the resistor assembly 36B is similarly constructed as the resistor assembly 36A illustrated in FIG. 2 but is interconnected with the conductive foil or power plane 22.

Similarly, referring particularly to FIG. 4, the resistor assembly 36C is also similarly constructed as the resistor assembly 36A while being arranged in conductive relation with the additional signal plane 28.

As illustrated in FIGS. 1–4, a resistor or circuit component assembly constructed according to the present invention may be arranged at the intersection of any through-hole with any conductive plane or layer or combination thereof in a PCB or the like. FIGS. 2 and 3 specifically illustrate resistor assemblies interconnected with either the power or ground planes 22 and 24 of a capacitive laminate. It will further be apparent from FIGS. 2 and 3 in combination with FIG. 1 that the surface devices 12 and 14 could thus be interconnected with both the respective resistor or other circuit component assemblies as well as the capacitive laminate by means of the same respective through-holes.

FIG. 4 illustrates that the resistor or circuit component assembly could be arranged in other conductive layers of the PCB. It is also to be understood that those conductive layers could even be formed on one of the lateral surfaces of the PCB.

Furthermore, the resistor assemblies 36A, 36B and 36C of FIGS. 2–4 are generally illustrated at the intersection of through-holes formed in the PCB 10 for other purposes. More specifically, the through-holes illustrated in FIGS. 2–4 are generally contemplated for providing necessary electrical connections for the respective surface devices with various components within the PCB. In that case, the resistor assemblies 36A, 36B and 36C are merely added at the juncture of those preexisting through-holes with selected conductive layers in the PCB.

At the same time, it is to be understood that a resistor or circuit component assembly constructed according to the present invention could similarly be provided at the intersection of a through-hole and a conductive plane, such a through-hole specifically being provided for purposes of connection with the assembly. In other words, the resistor or circuit component assembly of the present invention is not to be limited to use with through-holes pre-existing in the PCB for other purposes.

In one embodiment of the present invention, the assembly 36A is preferably formed from a conductive/resistive material exhibiting a desired resistance.

Figure 6:
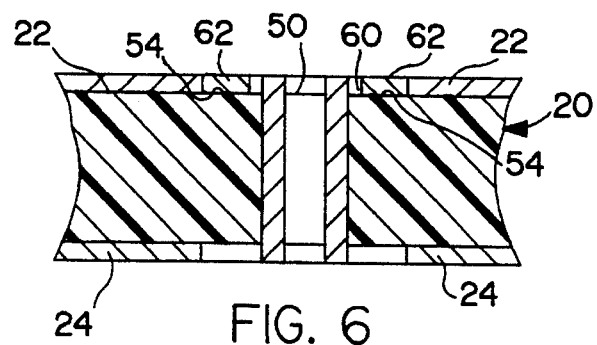
FIG. 6 is a fragmentary view taken along section lines VI—VI of FIG. 5A.

The construction of the resistor circuit component assembly 36A is illustrated in greater detail in FIGS. 5A and 6. Here again, it is to be understood that the configuration of the assemblies 36B and 36C is similar to that described below for resistor circuit component assembly 36A.

Referring now to FIGS. 5A and 6, the capacitive laminate 20 is illustrated as a component for inclusion in the PCB 10 of FIGS. 1–4. For that purpose, the conductive foils or power and ground planes 22 and 24 are initially laminated to the dielectric layer 26 in order to form the capacitive laminate 20 as a structurally self-supporting component.

In the capacitive laminate 20, the resistor circuit component assembly 36A is formed on the upper conductive foil or power plane 22. As noted above, the method of formation for the resistor circuit component assembly is particularly simple. At the same time, the method of formation for the resistor circuit component assembly of the invention makes it particularly easy to change the effective resistance for each resistor assembly as described in greater detail below.

Initially, an annular recess 54 is formed in the conductive foil or power plane 22 between an outer periphery 56 and an inner periphery 58. In addition, since the conductive foil 22 was originally in conductive relation with the through-hole 50, formation of the annular recess 54 also forms a conductive pad 60 between the inner periphery 58 and the plated through-hole 50.

Since the power plane 22 is formed from conductive material, it is thus a simple matter to etch the annular recess 54 at the same time that other circuit elements are etched into the conductive foil 22 as is conventional for a capacitive laminate in such a PCB.

A resistor body 62 is then arranged or formed in the annular recess 54 so that it is electrically interconnected with the power plane, 22 and the conductive pad 60 at the outer and inner peripheries 56 and 58 respectively.

Preferably, the annular recess 54 is formed with its outer and inner peripheries 56 and 58 having constant radii and the conductive pad 60 having a similar thickness as the power plane 22, at least adjacent the inner and outer peripheries 58 and 56.

These features particularly simplify predetermination or calculation of the total resistance for the resistor body 62 from the respective radii for the outer and inner peripheries 56 and 58, the thickness of the power plane 22 (and accordingly the conductive pad 60) and the resistivity of material from which the resistor body 62 is formed. It is assumed that the thickness of the resistor body 62 is approximately equal to the thickness of the power plane 22 and the conductive pad 60.

FIG. 5B is provided to illustrate a simplified manner of calculation for determining the resistance of the resistor body 62 as described in greater detail below.

At least in a preferred embodiment of the present invention with the outer and inner peripheries of the resistor circuit component or resistor circuit component assembly having constant radii, the effective resistance of the resistor or resistor assembly may be determined as follows, having reference to FIG. 5B.

If R equals resistance, then it is well known that resistance may be calculated as $$R = \frac{\rho L}{wH}$$

where R equals resistance in ohms, p equals resistivity of the resistor in ohms centimeters, L equals the length of the resistor in centimeters, w equals the width of the resistor in centimeters and H equals the height of the resistor in centimeters (wH thus being the effective cross-sectional area of the resistor for purposes of calculating its resistance).

Referring now to FIG. 5B, the resistor body 62 is graphically illustrated with substantially constant radii forming its outer and inner peripheries 56 and 58. Further, since the resistor body 62 forms a resistor between the conductive pad 60 and the conductive layer or upper surface 22, then the effective length of the resistor body 62 is equal to the radial dimension of the resistor body, that is $r_2-r_1$. The effective width of the resistor body is thus the mean circumference of the resistor body, that is the circumference of the resistor body generated from a point mid-way between the outer and inner peripheries 56 and 58. Thus, the effective width of the resistor body may be stated as follows:

$$W = 2\left[\frac{r_2 - r_1}{2} + r_1\right]\pi$$

These effective values for length and width may then be substituted into the basic equation set forth above for resistance. It may readily be seen from FIG. 5B that the overall resistance of the resistor body will be proportional to the differential radius, that is $r_2-r_1$. At the same time, resistance is inversely proportional to the effective width of the resistor body as stated above.

The above equations can readily be employed for adjusting the radii of the outer and inner peripheries of the resistor body in order to provide any desired resistance, at least given the effective height (H) for the resistor body. It is also possible of course to permit variation of the effective height of the resistor body for purposes of determining overall resistance.

Referring briefly to FIG. 5C, in another version of the preferred embodiment of the annular circuit component assembly of the present invention, it is illustrated that the inner periphery 58''' of an annular circuit component 36D can be defined by the outer perimeter of the through-hole 50''' However, in this embodiment, the thickness (h) of the power plane 22 may also be used to determine the effective height (H) of the circuit component body 62 for purposes of the above calculations.

The equations set forth above thus readily facilitate the calculation of resistance relative to dimensions for a preferred embodiment of the resistor body as illustrated in FIG. 5B. At the same time, variations in the configuration of the resistor body may similarly be included in such mathematical determinations, but possibly with increased complexity relative to the equations set forth above.

In this regard, a more precise calculation of the resistance of an annular ring resistor circuit component assembly 62 such as that illustrated in FIG. 5B may be determined as follows, having reference to FIGS. 5B, 5C and 5D.

Initially, having reference to FIG. 5D, the resistance (R) of a material between points a and b (of any material shape) can be expressed in microscopic terms by the following relationship where (V) equals voltage, (i) equals current, (E) equals electric field, (j) equals current density and (ρ) equals scalar quantity resistivity:

$$R = \frac{V_{ab}}{i} = \frac{\int_b^a E\,dl}{\int j\,dS}$$

In this expression, the line integral dl defines the line ab along the path E, and a closed loop path (perpendicular to the direction of current flow) is defined by the surface integral dS, which corresponds to the area enclosed by a current (i).

The above expression for a rectangular resistor body with dimensions (h, w, l), as shown in FIG. 5D, upon integration readily yields the macroscopic quantity which states that the resistance is directly proportional to its length and indirectly proportional to its cross-sectional area, $$R = \frac{\int_b^a E dl}{\int j dS} = \frac{E}{j} \quad \frac{l}{wh} = \rho \frac{l}{wh}$$

A model of an annular resistor body 62 is shown in FIG. 5B. The model has been simplified in that the resistor body 62 does not overlap the top of the conductor power plane 22. Overlapping the conductor plane reduces the resistance of the resistor per unit volume by exposing more resistor contact area to the copper foil. If overlap cannot be avoided, the expression can be modified to account for overlap as shown by equation (7) below. Furthermore, the model of the annular resistor body 62 has been also simplified in that the effective height (h) of the resistor body 62 may be simply determined from the thickness of the power plane 22.

Referring still to FIG. 5B, an annular resistor body 62 is illustrated with substantially constant radii forming its outer and inner peripheries 56 and 58. The resistance value of the annular geometry can only be approximated and is not accurately described by the above expression relating to the rectangular resistor geometry. The cross-sectional area of the annular resistor 62 is a continuously and smoothly changing function of the radii. This functionality is described by the logarithmic ratio of the outer to inner ring diameter, $r_2$ and $r_1$ respectively. Assuming that the radial symmetry between the inner contact pad 60 and the annular resistor body 62 is controlled and maintained during processing, then, the resistance of the annular resistor geometry is exactly expressed as:

$$R = \frac{\int_b^a E dl}{\int j dS} = \frac{E}{j} \quad \frac{\int_{r_1}^{r_2} \frac{dr}{r_1}}{\int_0^h \int_0^{2\pi} r dh d\phi} =$$

$$\frac{\rho}{2\pi h} \int_{r_1}^{r_2} \frac{dr}{r} = \frac{\rho}{2\pi h} \ln \frac{r_2}{r_1}$$

Further, if overlap cannot be avoided, the above expression can be modified as follows:

$$R(\rho, h, d_1, d_2) = \frac{\rho}{2\pi h} \ln \frac{d_2}{d_1} + \rho[\text{OVERLAP FACTOR}]$$

In this expression, $d_2/d_1$ describes the ratio of the outer to inner diameters (not otherwise shown).

The equations set forth above thus provide for the exact calculation of the resistance of an annular resistor circuit component formed by the teaching of the present invention, either with or without processing overlap of the resistor body.

It may also be seen from the method of forming the resistor body 62 that its effective resistance may be predetermined simply by selecting the appropriate radii for the outer and inner peripheries 56 and 58. In other words, given the effective thickness of the resistor body and the resistivity of the material from which it is formed, the radii for the peripheries of the resistor body could then be selected in order to establish its effective resistance.

The resistor body is preferably formed from a liquid precursor such as a powdered resistor material suspended in a liquid. In this manner, the resistor body could be deposited and formed by conventional techniques if necessary or desired. However, it is to be understood that the resistor body could also be formed from other precursors either in liquid or paste or of other consistencies, even a dry film, for example, Generally any liquid precursor may be employed for forming the resistor body-as long as the precursor is capable of being filled or otherwise combined with a suitable resistor material either in the form of a powder or possibly larger particles. The precursor must also be selected so that it is capable of withstanding conventional PCB processing steps.

A particular liquid precursor suitable for use in the present invention may be taken for example from U.S. Pat. No. 4,870,746 issued Oct. 3, 1989 to Klaser under assignment to Litton Systems, Inc. The conductive or resistive inks described in that reference may also be used for forming the resistor body of the present invention. It is further to be noted that such conductive or resistive inks may be formed either as liquids capable of deposition by suitable silkscreen techniques as a paste suitable for extrusion or planing to form the resistor body. Referring again to FIG. 5A, for example, such techniques are particularly adapted for forming the resistor body 62 in an annular recess such as that indicated at 54.

For purposes of the present disclosure, the above noted patent is incorporated herein by reference as though set forth in its entirety.

Figure 7:
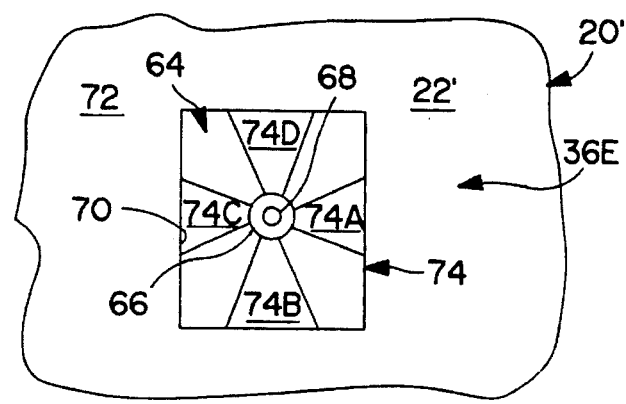
FIG. 7 is a fragmentary view illustrating a portion of a capacitive laminate similar to that illustrated in FIG. 5A to demonstrate another embodiment of the invention.

As noted above, the term "annular recess" is employed in a broadest sense to include other than simple round configurations. Referring for example to FIG. 7, a circuit component assembly 36E could be formed as a replacement for any of the circuit component assemblies 36A, 36B or 36C. As illustrated in FIG. 7, the circuit component assembly 36E is formed with an annular recess 64 formed between an inner periphery 66 provided by a plated through-hole 68 and an outer periphery 70 adjacent a conductive plane 72. However, in the configuration of FIG. 7, the outer periphery 70 is rectangular.

At the same time, a circuit component body 74 is formed by similar segments 74A–D arranged in conductive interconnection with both the inner and outer peripheries 66 and 70.

Thus, FIG. 7 illustrates that a circuit component assembly can be formed according to the present invention with different configurations (or different geometric shapes forming the outer and inner peripheries) for the annular recess. The inner periphery of the recess can actually be formed by the plated through-hole itself as illustrated in FIG. 7. Design variations such as those illustrated in FIG. 7 may be desirable for employing the circuit component assembly of the present invention in different applications.

It is noted that the above discussion regarding the formation of the annular resistor circuit component assembly 36A or annular resistor body 62 is applicable to the formation of any of the annular circuit components of the present invention. In this regard, an annular conductor circuit component may be formed in the same manner as that above where the precursor material exhibits low resistivity (higher conductivity). Similarly, an annular inductor circuit component may be formed as above where the precursor material exhibits inductive properties such as with a ferro-magnetic precursor material arranged in a suitable matrix. Further, a dielectric/capacitive annular circuit component may be formed by employing a suitable dielectric material, as described below.

In another preferred embodiment of the present invention, it is contemplated to provide an annular inductor circuit component coupled with a PCB through-hole. It is further contemplated by the present invention that the annular inductor or inductor assembly have outer and inner peripheries with substantially constant radii where the inductance of the inductor or inductor assembly may be determined as follows.

Initially, just as with the annular resistor body 62 of FIG. 5B, the cross-sectional area of the annular inductor is a continuously and smoothly changing function of the radii. This functionality is described by the logarithmic ratio of the outer to inner diameters. Assuming that the radial symmetry between the inner periphery of the inductor body and the contact pad or conductive plated through-hole is controlled and maintained during processing then, the functional relationship for the annular inductor body may be expressed by the following:

Let:
  $\mu$=permeability (H m$^{-1}$) of the ferromagnetic core
  h=thickness of the ferromagnetic core
  and the inductance (L) per unit length for an annular core inductor having an inner radius of $r_1$ and an outer radius of $r_2$ may be determined in the following manner:

$$\frac{L}{h} = \mu \left[ \frac{1}{8\pi} + \frac{1}{2\pi} \ln\left(\frac{r_2}{r_1}\right) \right] (Hm^{-1})$$

The above equation can readily be employed for adjusting the radii of the outer and inner peripheries of the annular ring inductor body in order to provide a desired inductance, at least given the effective height (h) for the inductor body. It is also possible of course to permit variation of the effective height of the inductor body for purposes of determining overall inductance.

The equation set forth above thus readily facilitates the calculation of inductance relative to dimensions for a preferred embodiment of the inductor body with the same structure as that illustrated by the annular resistor body 62 of FIG. 5B. At the same time, variations in the configuration of the inductor body may similarly be included in the mathematical determination, but possibly with increased complexity relative to the equation set forth above.

Either the annular resistor body 62 (more broadly a conductor/resistor) or the annular inductor circuit component described above may also be replaced by an annular dielectric/capacitor formed as also described above wherein the liquid precursor includes material exhibiting dielectric properties such as epoxy or, for example, ceramic particles preferably having a high dielectric constant. As noted above, such a component can function either as a dielectric (isolator) or capacitor depending particularly upon the dielectric constant for the resulting annular dielectric/capacitive annular circuit component.

In this regard, the capacitance (C) per unit length for an annular capacitor assembly of the present invention formed with substantially constant radii and having an inner radius of $r_1$, an outer radius of $r_2$, and an effective thickness (h) may be determined by the following equation:

$$\frac{C}{h} = \frac{2\pi\epsilon}{\ln\frac{r_2}{r_1}}$$

$\epsilon$ being defined as follows:

$$\epsilon = 8.85 \frac{\text{picofarads}}{\text{meter}} (\epsilon_r)$$

where $\epsilon_r$ is the relative permutivity of the annular medium.

It is further contemplated by the present invention to provide compound circuit components (or networks) formed from operative combinations of passive circuit components such as conductor/resistors, inductors and dielectric/capacitors.

Figure 8:
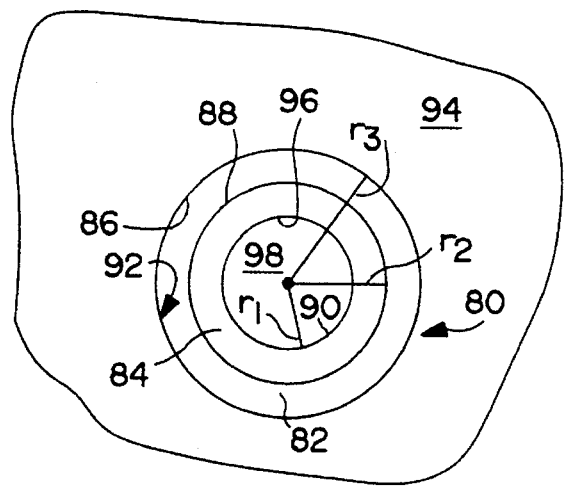
FIG. 8 is a plan view of a similar annular circuit component having concentric rings with different electrical characteristics.

In one preferred embodiment it is specifically contemplated to form compound circuit component assemblies within an annular recess in internal or external layers of a PCB where an annular passive circuit component is arranged within a different annular circuit component to form a series of operatively interconnected concentric circuit component bodies as illustrated by FIG. 8. In this regard, the term concentric is employed to mean a plurality of circuit component bodies having a common axis where those bodies may be of a variety of geometric shapes.

Referring to FIG. 8, the compound circuit component assembly 80 is formed within the annular recess 92 in a conductive plane 94 of a laminate in a PCB (not otherwise shown). An annular dielectric body 82 is formed with its outer periphery 86 in operative contact with the conductive plane 94 and having a constant radius $r_3$. The inner periphery 88 of the dielectric body 82 has a constant radius $r_2$ and is generally co-extensive and in operative contact with the outer periphery 96 of an annular inductor body 84. The inductor body 84 may be formed, for example, from a ferro-magnetic material arranged in a suitable matrix. The outer periphery 96 of the annular inductor body 84 has a constant radius which is substantially equal to $r_2$. The inner periphery 90 of the inductor body 84 has a constant radius $r_1$ and is generally co-extensive and in operative contact with the conductively plated through-hole 98 in the PCB (not otherwise shown).

In the annular compound circuit component assembly 80 illustrated in FIG. 8 the dielectric body 82 is employed to provide conductive isolation from the conductive layer 94 in the PCB laminate. In this regard, the dielectric body 82 may be formed, for example, from a suitable dielectric material having a sufficiently low dielectric value.

Other compound circuit component assemblies may be formed under the present invention in same manner as discussed above where the particular circuit components are varied to provide a desired compound circuit (or network). A process of forming a compound circuit component assembly such as that indicated as 80 in FIG. 8 will be act forth below.

Several possible compound circuits formed by the present invention are illustrated in the equivalent circuit diagrams included as FIGS. 9A, 9B, 10A, 10B, 11A, 11B, 12A and 12B.

Figure 9A:
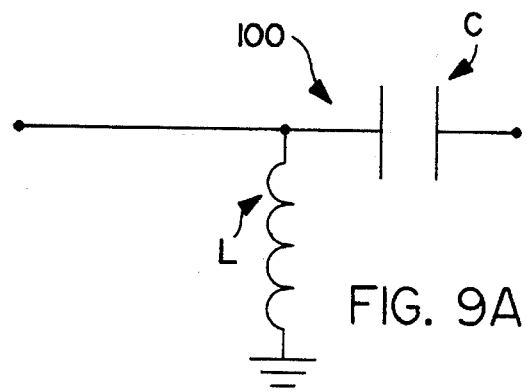
FIGS. 9A and 9B are schematic representations of high pass filter assemblies respectively including an inductor and capacitor or a resistor and capacitor.
Figure 9B:
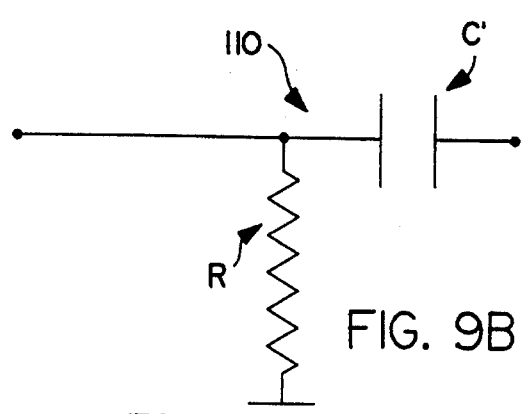

Initially, FIGS. 9A and 9B illustrate High Pass Filter assemblies formed respectively with an inductor L and capacitor C or a resistor R and capacitor C' for the purpose of restricting relatively low frequency signals while allowing relatively high frequency signals to be passed through the circuit. In each of the circuit arrays of FIGS. 9A and 9B, the capacitor may preferably be formed by a capacitor laminate formed by multiple layers of a PCB, the inductor or resistor being generally coupled with the capacitor to form the equivalent circuits 100 and 110 illustrated in those figures.

Figure 10A:
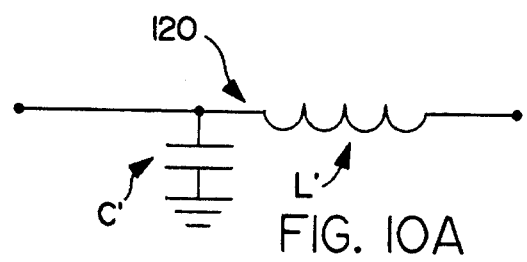
FIGS. 10A and 10B are similarly schematic representations of low pass filters respectively including a capacitor and inductor or a capacitor and resistor.
Figure 10B:
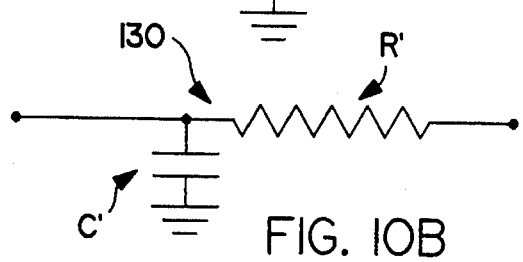

FIGS. 10A and 10B similarly illustrate Low Pass Filter assemblies formed, for example, from components similar to those described above in connection with the equivalent circuits of FIGS. 9A and 9B. However, in fie equivalent circuits 120 and 130 of FIGS. 10A and 10B, the components are interconnected in the manner generally illustrated in the figures in order to filter or restrict relatively high frequency signals while allowing relatively low frequency signals to be passed through fie circuit. It is also noted fiat, in all of the equivalent circuits of FIG. 9A, 9B, 10A and 10B, the capacitor serves a particular function of establishing the level of separation for relatively high and low frequency signals.

Figure 11A:
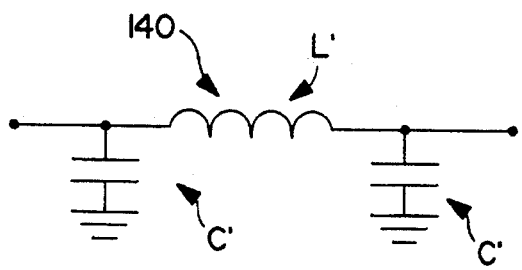
FIGS. 11A and 11B are schematic representations of pi filters both including parallel capacitors coupled respectively with either an inductor or resistor.
Figure 11B:
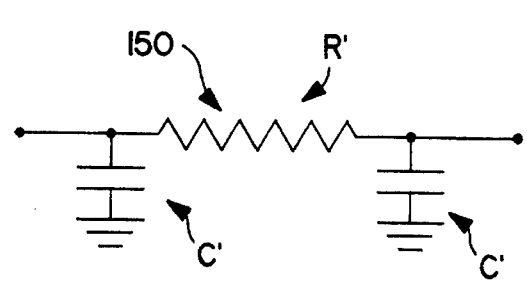

FIGS. 11A and 11B are similarly equivalent circuits of pi Filters. Here again, the equivalent circuits 140 and 150 of FIGS. 11A and 11B are relatively similar to the equivalent circuits of FIGS. 10A and 10B but with capacitors coupled on opposite sides of the respective inductor or resistor and interconnected in parallel to ground in order to accomplish the intended function.

Figure 12A:
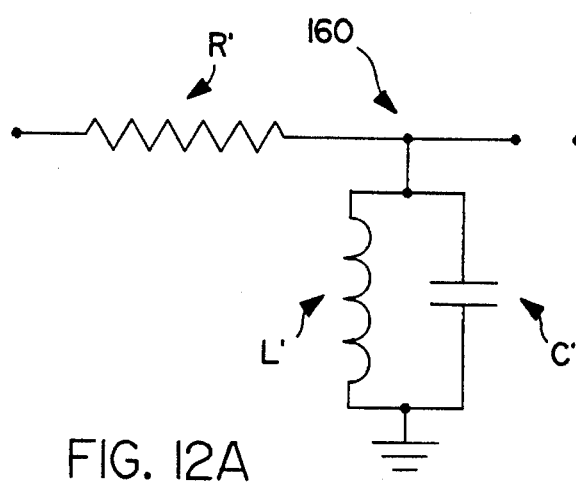
FIGS. 12A and 12B are schematic representations of bandpass filters formed respectively from a parallel arrangement of an inductor and capacitor coupled with a resistor or a capacitor and inductor coupled in series with each other and with a resistor as illustrated.
Figure 12B:
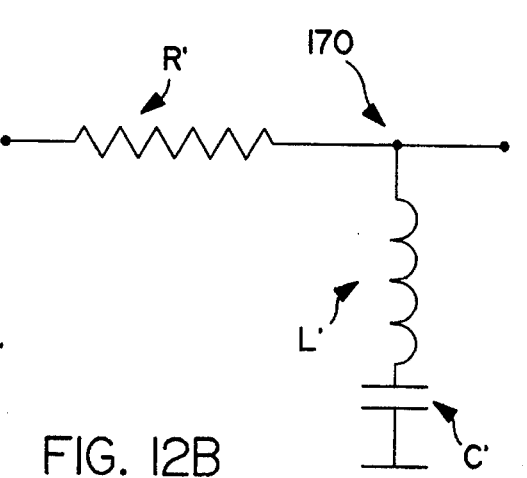
Figure 13:
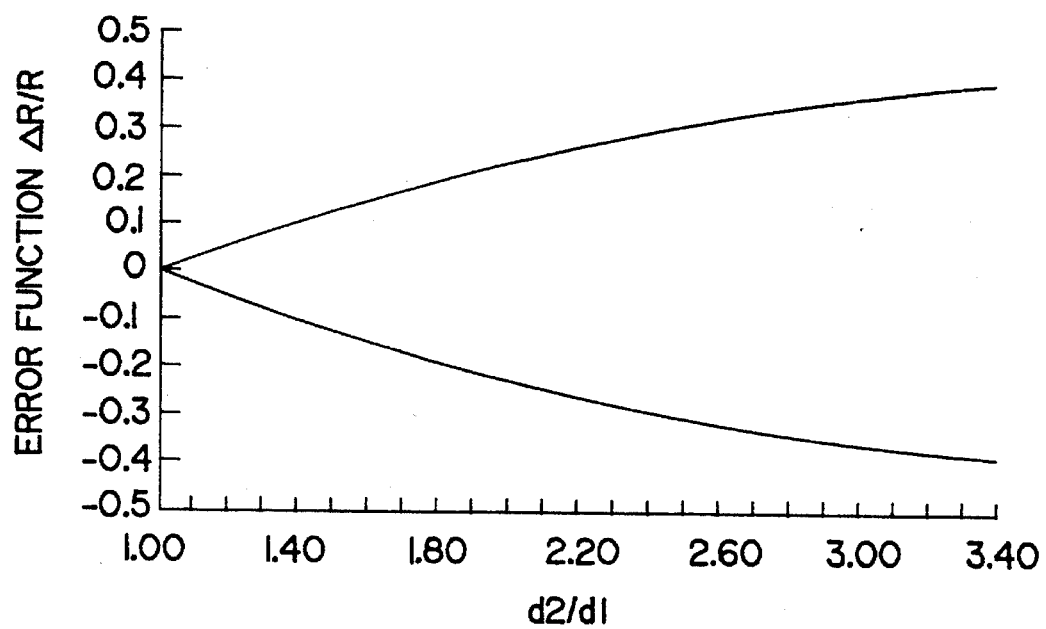
FIG. 13 is a graphical representation of a resistor tolerance envelope for an annular ring resistor.

FIGS. 12A and 12B illustrate equivalent circuits 160 and 170 for Band Pass Filters wherein a resistor provides the signal communication, for example, through a PCB, one side of the resistor being coupled to ground respectively through either a parallel or series arrangement of an inductor and capacitor as illustrated to accomplish the intended function.

Methods of forming the circuit component assembly or circuit component body of the present invention are believed clearly apparent from the preceding description of the invention. However, methods of formation are described below in order to assure a complete understanding of the invention.

Initially, referring for example to FIGS. 5A and 6, an annular recess is formed in a conductive plane, the annular recess having an outer periphery and an inner periphery such as those described above. Preferably, the inner periphery also defines a conductive pad. A through-hole may be formed axially within the conductive pad either prior to formation of the annular recess or after formation of the resistor body and even following its inclusion in a PCB such as that indicated at 10 in FIGS. 1–4.

Returning to the specific method, the resistor body is then formed in the annular recess. Preferably, the resistor body is at least co-extensive with the annular recess and preferably overlaps the outer and inner peripheries while at the same time being at least as thick as the conductive plane from which the annular recess was formed. As described above, this particularly simplifies determination of the effective resistance for the resistor body. With the resistor assembly thus being formed, the conductive plane including the resistor assembly is then laminated into the PCB or similar circuit board assembly as described above. As was also noted above, the necessary through-holes could be formed following completion of the PCB.

A preferred process for screening materials in the form of a liquid precursor into an annulus formed in a conductive layer of a PCB may be carried out as described below with reference to FIGS. 14–20 and FIGS. 17A, 18A, 17B and 18B considered in combination with FIGS. 14–20. In that regard, FIGS. 14–20 contemplate formation of a single circuit component in the annular space while FIGS. 17A–18B, taken together with FIGS. 14–20, illustrate a variation of the process for depositing multiple components in the annular recess.

Figure 14:
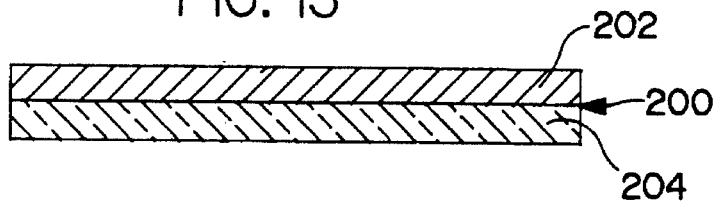
FIGS. 14–20, taken together, provide a representation of sequential processing steps for forming an annular resistor or circuit component assembly according to the present invention.
Figure 15:
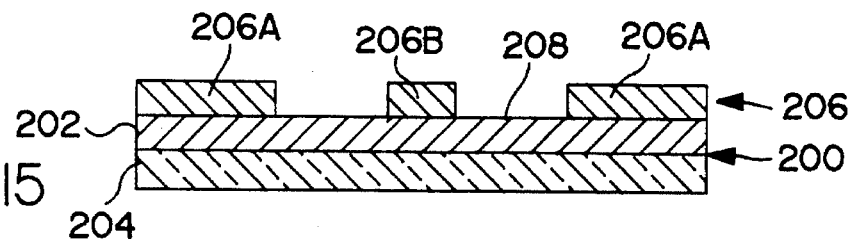

Referring initially to FIGS. 14–20, a disposable contact layer 206, preferably formed as a dry film image by silkscreening of a suitable photoimaging polymer such as an epoxy (or, for example, polymers employed as soldermask), is imaged onto a conductive layer 202 of a laminate 200, for example, in a PCB (not otherwise shown). Preferably, the conductive layer 202 may be a copper foil laminated to a suitable glass or epoxy layer or substrate 204 as illustrated in FIGS. 14 and 15.

Referring particularly to FIG. 15, the disposable contact layer 206 is applied to the conductive layer 202 of the laminate 200 to provide a generally continuous protective layer with a selected area or areas 208 exposing or leaving unprotected the underlying conductive layer or film 202.

Figure 16:
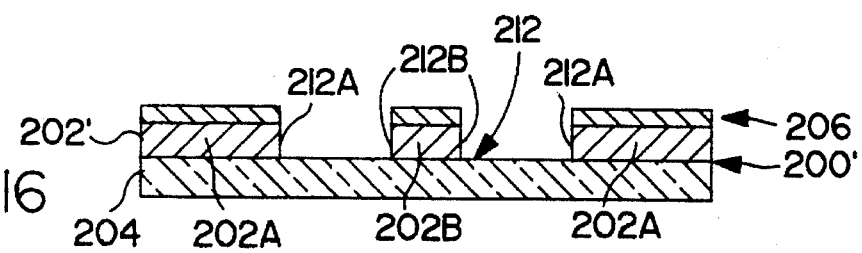

Referring particularly to FIG. 16, a subtractive step such as copper etching is then carried out whereby the exposed area or portion 208 (see FIG. 15) of the conductive layer 202 is removed from the laminate 200 to form an annular recess 212 (see FIG. 16) in the conductive layer 202' of the laminate 200'. Preferably, the exposed area 208 is in an annular configuration surrounded by a generally continuous portion 206A of the contact layer with a central island 206B. The surrounding portion 206A and the central portion 206B thus respectively define outer and inner peripheries 212A and 212B for the annular recess 212.

Figure 17:
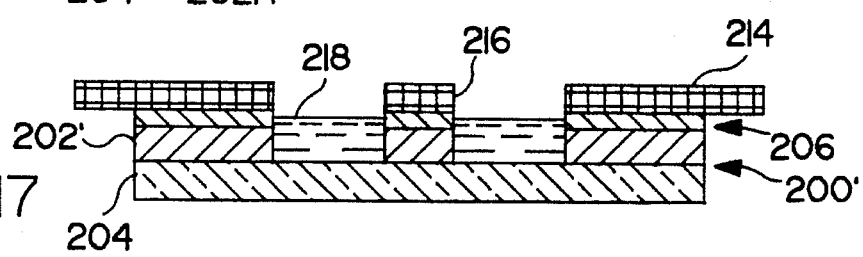
Figure 17A:
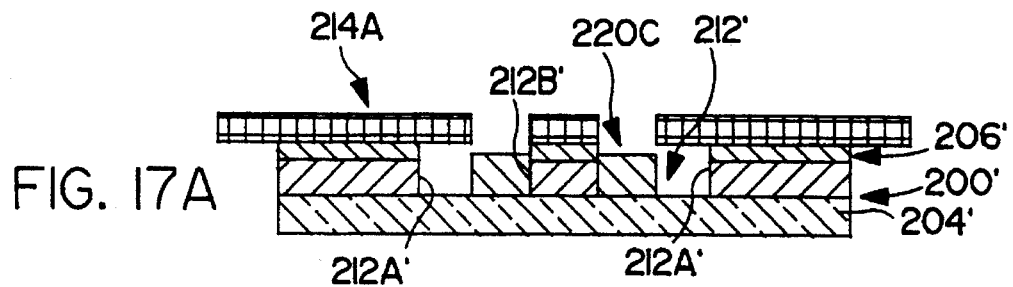
FIGS. 17A, 18A, 17B and 18B, taken together, represent an alternative to the method of FIGS. 14–20 and are adapted for forming an annular circuit component having different concentric elements.

Referring particularly to FIG. 17, a screen or stencil 214 is then arranged above the disposable contact layer 206, the screen or stencil 214 having an opening or openings 216 corresponding to the annular recess 212 in the conductive layer 202'. The screen or stencil 214 may be a conventional silk, polyester or steel mesh screen, for example, as is well known in the art of PCB manufacture and elsewhere.

Following arrangement of the screen 214 as described above, and continuing to refer particularly to FIG. 17, a precursor 218 for the desired circuit component is then applied through the stencil or screen 214 in order to fill the annular recess 212 in the conductive layer 202' and thus form the circuit component as an annular body also illustrated at 218. In this regard, the precursor 218 is preferably a liquid precursor or ink formed for example from a polymer system such as epoxy to provide a carrier for a suitable material forming the desired circuit component. In this regard, with the desired circuit component being either a resistor or conductor, a suitable conductive material such as a conductive polymer or particulate metal having desired characteristics of resistance and conductance is dispersed within the liquid precursor. In the case of an inductor, a suitable magnetic material such as particulate ferrite is dispersed within the liquid precursor material. Similarly, either a dielectric or capacitor may be formed by dispersing a suitable material such as a ceramic having a desired dielectric constant in the liquid precursor. Here again, the circuit component functions as a dielectric or capacitor primarily depending upon the dielectric constant formed for the circuit component. Furthermore, in the case of a capacitor, it is necessary to provide a conductor at both the outer and inner peripheries 212A and 212B of the annular recess 212. This function is of course performed by the surrounding portion 202A and the central portion 202B of the conductive layer 202' as best illustrated in FIG. 16.

Figure 18A:
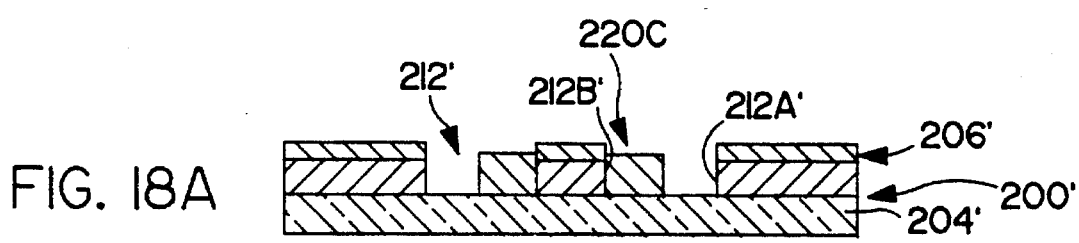
Figure 18B:
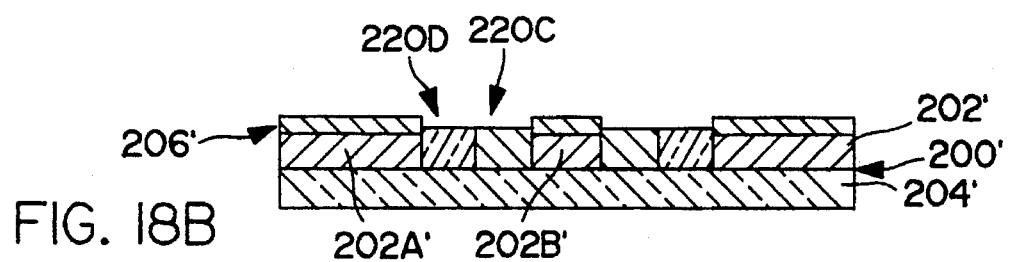
Figure 18:
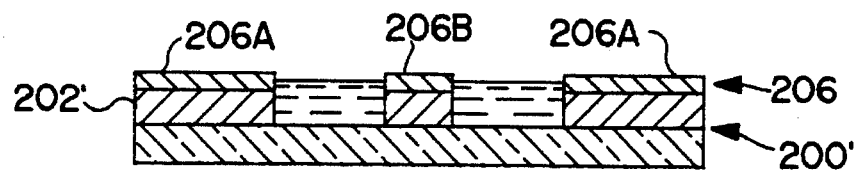
Figure 19:
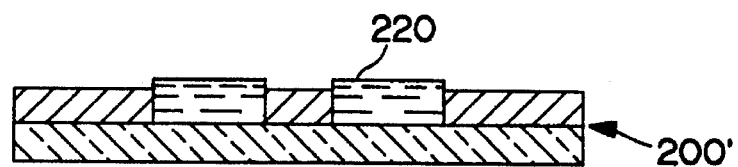

Following formation of the circuit component in the annular recess 212, the screen or stencil 214 is then removed and the precursor material is prebaked in order to at least partially cure the precursor material in an step represented by FIG. 18.

Figure 20:
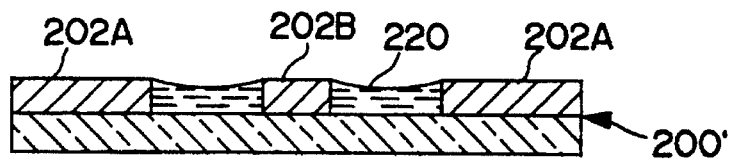

After the prebaking step described above, the disposable contact layer 206 is removed or stripped from the laminate 200' in order to expose a partially cured circuit component 220. The laminate 200' may then be subjected to a final cure step represented by FIG. 20 in order to complete curing of the annular circuit component 220 so that it is preferably generally coplanar with the surrounding portions 202A of the conductive layer 202' as illustrated in FIG. 20.

Thus, there has been described above a process for forming an annular circuit component which may be either a resistor/conductor, an inductor or a dielectric/capacitor in a layer of a laminate or PCB.

The present invention further contemplates a variation of the process described above in order to form multiple components in the annular recess 212. Such a process may be carried out for example by repetitive performance of the steps described above with respect to FIGS. 17 and 18. The repetitive steps are illustrated respectively in FIGS. 17A, 18A, 17B and 18B and are described below in order to assure a complete understanding of the invention.

Following performance of the same steps described above with reference to FIGS. 14–16, the screen or stencil 214A is preferably formed to expose only an inner concentric portion 212C of the annular space 212'. A precursor for a first circuit component 220C is then deposited in the exposed portion of the annular recess 212' to form the component 220C.

Figure 17B:
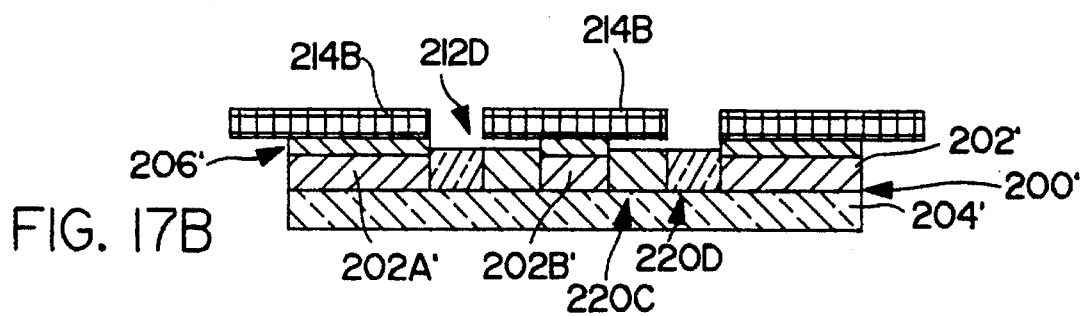

The screen 214A is then removed as illustrated in FIG. 18A and replaced by a second screen 214B as illustrated in FIG. 17B exposing an outer concentric portion 212D of the annular recess 212'. A separate precursor material is then applied through the screen 214B in order to form a second circuit component 220D in an outer concentric portion of the annular recess 212'. Thus, the annular recess 212' is filled with two concentric circuit components 220C and 220D as described above.

Thereafter, the second screen 214B may be removed as illustrated in FIG. 18B and the remaining steps of the process carried out as described above with reference to FIGS. 14–20.

Some variations may be desirable in the alternate method for forming compound circuit components. For example, it may be desirable to prebake or otherwise treat the precursor for the initially deposited component 220C in order to assure that it fills only the desired inner concentric portion of the annular recess 212'. After deposition of the second circuit component 220D to completely fill the annular space 212', further curing may be carried out in a generally similar manner as described above with reference to FIGS. 14–20 in order to complete formation of the compound circuit components 220C and 220D.

The specific functions of the circuit components 220C and 220D may of course be determined by the use of suitable materials dispersed within the liquid precursor as described above for either a resistor/conductor, inductor or dielectric/capacitor, for example.

The compound method described immediately above could of course be further varied in order to form additional circuit components in a compound configuration. Furthermore, the alternate compound method could also be varied in order to form separate circuit components in other than the concentric relation described above. For example, radial segments of the annular region 212' could be respectively exposed and filled during the process in order to form suitable circuit components, if desired, which would then be in generally parallel interconnection between the conductive elements provided by the outer portion 202A' and inner portion 202B' of the conductive layer 202'.

It is further contemplated that the processes described above may be employed to form one or more circuit components in an annular recess surrounding a via or through-hole (not illustrated in FIGS. 14–20). Such a via or through-hole is illustrated for example in FIGS. 1–4. Accordingly, the processes described above may be further varied by formation of such a via or through-hole, for example, to replace the central portion 202B or 202B' of the conductive layer 202 or 202'.

In any event, there have been described above different embodiments of a novel circuit component assembly contemplated for arrangement in an annular recess or at the intersection between a through-hole and a conductive plane in a PCB or the like. There have also been described multiple methods for forming such circuit components. Additional variations in both the embodiments and processes described above will be apparent from the preceding description. Accordingly, the specific scope of the invention is defined only by the following claims which are further exemplary of the invention.

What is claimed is:

1. A method of forming a circuit component assembly in a conductive layer of a printed circuit board (PCB), comprising the steps of:

forming an annular recess in the conductive layer about a conductive element comprising one of (a) a through-hole and (b) a central conductor in the PCB;

forming a circuit component assembly in the annular recess, the circuit component assembly including at least one circuit component body and having an outer perimeter interconnected with the conductive layer; and operatively interconnecting the conductive element with an inner perimeter of the circuit component assembly.

2. The method of claim 1 further comprising the step of forming the outer and inner perimeters of the circuit component assembly with substantially constant radii and forming the circuit component assembly to be generally coextensive with the annular recess whereby the outer perimeter of the circuit component assembly is connected with the conductive layer and the inner perimeter of the circuit component assembly is operatively connected with the central conductive element.

3. The method of claim 1 further comprising the step of forming a conductive pad interconnected between the conductive through-hole and the inner perimeter of the circuit component assembly.

4. The method of claim 3 further comprising the step of forming the outer and inner perimeters of the circuit component assembly with substantially constant radii and forming the circuit component assembly to be generally coextensive with the annular recess whereby the outer perimeter of the circuit component assembly is in full register with the conductive layer and the inner perimeter of the circuit component assembly is in full register with the conductive pad.

5. The method of claim 4 further comprising the step of forming the conductive layer and conductive pad with generally equal thicknesses at their respective interconnections with the circuit component assembly for establishing the effective thickness of the circuit component assembly.

6. The method of claim 5 further comprising the step of forming the circuit component body from a liquid precursor.

7. The method of claim 1 wherein the conductive layer is a portion of a capacitive laminate in the PCB.

8. The method of claim 1 further comprising the step of forming the circuit component assembly body from a liquid precursor.

9. A method of forming a circuit component assembly in a conductive layer of a PCB laminate comprising the steps of:

applying a protective layer onto the conductive layer of the laminate to expose an annular portion of the conductive layer;

removing the exposed portion of the conductive layer by a subtractive step to form an annular recess in the conductive layer around a conductive center portion;

depositing a liquid precursor into the annular recess;

removing the protective layer from the conductive layer of the laminate; and curing the liquid precursor to form the annular circuit component assembly with its outer periphery connected to the conductive layer of the laminate and its inner perimeter connected to the conductive center portion.

10. The method of claim 9 wherein the liquid precursor comprises a circuit component material selected from the group consisting of conductive/resistive materials, inductive materials and dielectric/capacitive materials.

11. The method of claim 9 further comprising the step of forming a conductive element comprising one of (a) a through-hole, and (b) a central conductor in the conductive center portion of the circuit component assembly and the underlying laminate structure whereby the central conductive element is operative connected with the inner perimeter of the circuit component assembly wherein the conductive laminate forms a portion of a CB.

12. The method of claim 9 further comprising the step of partially curing the liquid precursor prior to removal of the protective layer.

13. The method of claim 9 further comprising the steps of:

arranging a screen or stencil above the disposable contact layer after the subtractive step has been performed, the screen or stencil having an annular opening therein in register with the annular recess formed in the conductive layer by the subtractive step; and depositing the liquid precursor in the annular recess of the conductive layer of the laminate through the corresponding annular opening or openings in the screen or stencil.

14. The method of claim 12 wherein the circuit component material is selected from the group consisting of conductive/resistive materials, inductive materials and dielectric/capacitive materials.

15. The method of claim 13 further comprising the step of partially curing the liquid precursor prior to removal of the protective layer.

16. The method of claim 9 for forming a compound circuit component assembly and further comprising the steps of:

arranging a first screen or stencil above the disposable contact layer after the subtractive step has been performed, the first screen or stencil having an annular opening therein in register with a first portion of the annular recess formed in the conductive layer by the subtractive step;

depositing a first liquid precursor in the first portion of the annular recess in the conductive layer of the laminate through the corresponding annular opening in the first screen or stencil;

removing the first screen or stencil;

arranging a second screen or stencil above the disposable contact layer, the second screen or stencil having an annular opening therein in register with a second portion of the annular recess formed in the conductive layer by the subtractive step; and depositing a second liquid precursor in the second portion of the annular recess in the conductive layer of the laminate through the corresponding annular opening in the second screen or stencil.

17. The method of claim 16 wherein the first and second liquid precursors comprise materials selected from the group consisting of conductive/resistive materials, inductive materials, dielectric/capacitive materials and combinations thereof.

* * * * *